(12) United States Patent
Myer et al.

(10) Patent No.: US 10,960,781 B2
(45) Date of Patent: Mar. 30, 2021

(54) CHARGING INLET WITH THERMAL SENSOR

(71) Applicant: TE CONNECTIVITY CORPORATION, Berwyn, PA (US)

(72) Inventors: Nathan Philip Myer, Lancaster, PA (US); Jeremy Christian Patterson, Winston-Salem, NC (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 124 days.

(21) Appl. No.: 16/139,254

(22) Filed: Sep. 24, 2018

(65) Prior Publication Data
US 2020/0094688 A1    Mar. 26, 2020

(51) Int. Cl.
| | |
|---|---|
| *H02J 7/04* | (2006.01) |
| *H01R 13/66* | (2006.01) |
| *B60L 53/16* | (2019.01) |
| *B60L 53/60* | (2019.01) |
| *H02J 7/00* | (2006.01) |
| *H05K 7/20* | (2006.01) |
| *B60L 53/18* | (2019.01) |

(52) U.S. Cl.
CPC ............... *B60L 53/16* (2019.02); *B60L 53/18* (2019.02); *B60L 53/60* (2019.02); *H01R 13/6683* (2013.01); *H02J 7/007192* (2020.01); *H05K 7/2089* (2013.01); *B60L 2230/12* (2013.01); *B60L 2240/36* (2013.01); *H01R 2201/26* (2013.01)

(58) Field of Classification Search
CPC ................................. B60L 53/16; B60L 53/18
See application file for complete search history.

(56) References Cited

U.S. PATENT DOCUMENTS

| | | | |
|---|---|---|---|
| 2007/0216348 A1* | 9/2007 | Shionoiri | H02J 50/20 320/107 |
| 2009/0195237 A1 | 8/2009 | Feliss et al. | |
| 2009/0251007 A1* | 10/2009 | Adams | H02J 7/0036 307/70 |
| 2016/0093988 A1* | 3/2016 | Yue | A41D 13/0051 361/86 |
| 2016/0107530 A1 | 4/2016 | Roberts et al. | |
| 2016/0221458 A1* | 8/2016 | Lopez | B60L 53/14 |
| 2017/0237205 A1* | 8/2017 | Fuehrer | B60L 3/0023 439/620.22 |

OTHER PUBLICATIONS

International Search Report, International Application No., PCT/IB2019/057858, International Filing Date, Sep. 18, 2019.

* cited by examiner

*Primary Examiner* — David V Henze-Gongola (57) ABSTRACT

A charging inlet includes a power terminal and a thermal sensor for monitoring a temperature of the power terminal. The power terminal is configured to releasably engage a mating contact of an external power source. The power terminal includes a cylindrical shaft. The thermal sensor includes a substrate and a sensing element mounted on the substrate. The substrate is flexible and curves along at least a portion of an outer surface of the cylindrical shaft.

20 Claims, 5 Drawing Sheets

CHARGING INLET WITH THERMAL SENSOR

BACKGROUND

The subject matter herein relates to electrical charging systems that have electrical connectors for establishing conductive pathways for supplying current from power sources to batteries.

Electric vehicles, including fully electric and plug-in hybrid vehicles, have electrical charging systems for charging batteries that provide current used to propel the vehicles. The charging systems include a charging inlet on the vehicle that releasably couples to a mating connector connected to an external power source. Because the vehicle is immobilized during charging operations, there is a desire to reduce the duration of charging operations to reduce the amount of time that the vehicle is immobile. The charging duration can be reduced by increasing the rate of power (e.g., electric current) transfer. At high currents, components of the vehicle charging system, such as the charging inlet, may heat up due to electrical contact resistances. If left unchecked, the heat can damage the components of the charging system, such as by melting the components, and could potentially start a fire.

To prevent heat-related damage, some known charging systems have sensors for monitoring the temperature in or around the charging inlet. If the temperature that is measured exceeds a threshold, the charging systems reduce the power transfer rate and/or take other actions to maintain the temperature at a safe level that is unlikely to cause damage. However, the temperature sensing in known charging systems may be inaccurate and/or have a delayed response time. For example, to provide electrical isolation for the sensing circuitry from the high current conveyed through the power contacts, the temperature sensors may be positioned relatively far away from the power contacts and/or placed behind walls or other structures. But, the separation distance and intervening structures result in a significant temperature disparity between the power contacts and the temperature sensors, reducing the accuracy and slowing the response time of the sensors. As a result of the low accuracy and slow response time, known charging systems have limited control over the charging operation.

A need remains for a charging inlet having a thermal sensor that can more accurately and quickly monitor the temperature of the power contacts during a charging operation than known charging systems, allowing for greater power transfer rates during charging operations to reduce the charging duration without concern of causing heat-related damage.

SUMMARY

In one or more embodiments of the present disclosure, a charging inlet is provided that includes a power terminal and a thermal sensor for monitoring a temperature of the power terminal. The power terminal is configured to releasably engage a mating contact of an external power source. The power terminal includes a cylindrical shaft. The thermal sensor includes a substrate and a sensing element mounted on the substrate. The substrate is flexible and curves along at least a portion of an outer surface of the cylindrical shaft.

In one or more embodiments, a charging inlet is provided that includes a housing, a power terminal, and a thermal sensor for monitoring a temperature of the power terminal. The housing defines a cavity. The power terminal is held by the housing and extends into the cavity. The power terminal is configured to releasably engage a mating contact of an external power source. The thermal sensor includes a substrate and a sensing element. The substrate has a component side and a mounting side opposite the component side. The sensing element is mounted on the component side of the substrate. The mounting side of the substrate is mounted to an outer surface of the power terminal. The substrate is flexible and curves along a contour of at least a portion of a perimeter of the power terminal.

In one or more embodiments, a charging inlet is provided that includes first and second power terminals and a thermal sensor for monitoring a temperature of the first power terminal. The first and second power terminals are configured to releasably engage corresponding mating contacts of an external power source. The first and second power terminals are spaced apart from each other within a housing. The first power terminal includes a cylindrical shaft. The thermal sensor includes a substrate and a sensing element mounted on the substrate. The substrate is flexible and is mounted to the cylindrical shaft of the first power terminal such that the substrate curves along at least a portion of an outer surface of the cylindrical shaft. The sensing element of the thermal sensor is located between the first and second power terminals.

DETAILED DESCRIPTION

Figure 1:
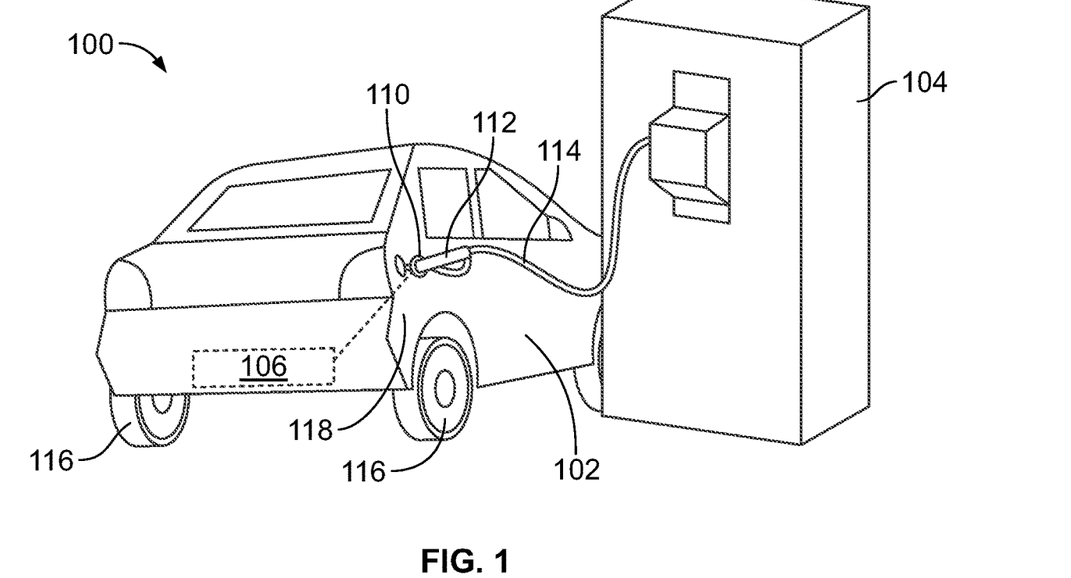
FIG. 1 illustrates a charging system that includes an electric vehicle parked next to a charging station according to an embodiment.

FIG. 1 illustrates a charging system 100 that includes an electric vehicle 102 parked next to a charging station 104 according to an embodiment. The electrical vehicle 102 includes an onboard battery pack 106 that is electrically connected to an onboard charging inlet 110. The battery pack 106 is illustrated in phantom in FIG. 1. The vehicle 102 may be a fully electric vehicle that lacks a combustion engine, a plug-in hybrid that includes both the battery pack 106 and a combustion engine, or the like. The battery pack 106 supplies electrical power (e.g., current) for powering a traction motor (not shown) of the vehicle 102 to provide tractive effort to the drivetrain and wheels 116 for propelling the vehicle 102. Optionally, the traction motor may be selectively functional as a generator when tractive effort is not desired, such as when driving downhill, to generate electrical energy for charging the battery pack 106 using regenerative braking. The battery pack 106 may represent an array of batteries and/or battery cells. Although the electric vehicle 102 is illustrated as a passenger automobile in FIG. 1, the embodiments of the charging inlet 110 described herein are not limited to use with passenger automobiles and may be installed on other types of vehicles, such as buses, trucks, rail vehicles, marine vessels, or the like.

The charging inlet 110 is configured to connect with a mating connector of an external power source to recharge the battery pack 106. In the illustrated embodiment, the charging station 104 represents the external power source, and a plug connector 112 represents the mating connector. When the vehicle 102 is not proximate to a charging station 104, other external power sources that can be used to connect to the charging inlet 110 for recharging the battery pack 106 include home electrical outlets, external generators, and the like. The mating plug connector 112 is coupled to the charging station 104 via an electrical power cable 114.

The charging inlet 110 is mounted to a side 118 of the vehicle 102 in the illustrated embodiment. The charging inlet 110 has a mating interface that releasably couples directly to the mating plug connector 112 to establish an electrical connection for conducting current from the charging station 104 to the battery pack 106. The charging inlet 110 may have a locking device (not shown) that releasably secures the mating connector 112 in a mated position with the charging inlet 110 to prevent premature disconnection of the mating plug connector 112 from the charging inlet 110.

Figure 2:
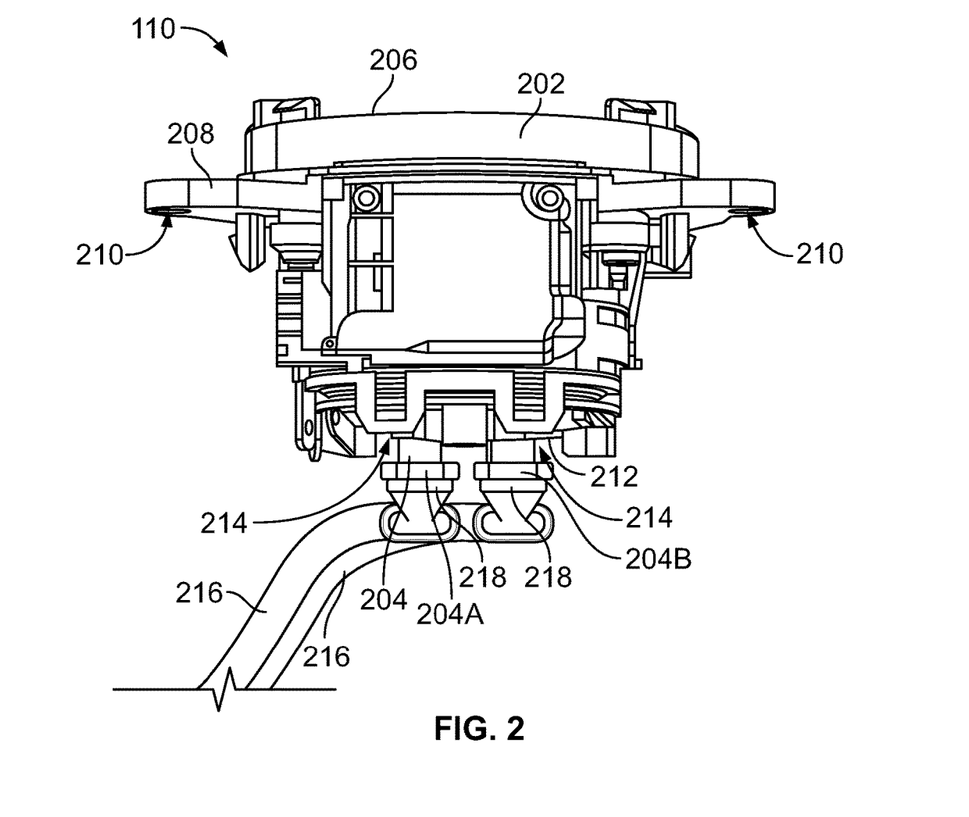
FIG. 2 is a top down view of a charging inlet according to an embodiment.

FIG. 2 is a top down view of the charging inlet 110 according to an embodiment. The charging inlet 110 includes a housing 202 and electrical power terminals 204 held by the housing 202. The housing 202 has a mating side 206 that couples to the mating connector 112 (shown in FIG. 1). For example, the mating side 206 has an interface that complements an interface of the mating connector 112. The housing 202 may include a mounting flange 208 that is used for mounting the charging inlet 110 to the vehicle 102 (shown in FIG. 1). For example, the mounting flange 208 may define apertures 210 that receive fasteners therethrough to secure the charging inlet 110 to a panel of the vehicle 102, such as a body panel or a chassis wall. The housing 202 extends from the mating side 206 to a back side 212 that is opposite the mating side 206. The housing 202 defines cavities 214 that extend from the back side 212 to the mating side 206.

The charging inlet 110 has two power terminals 204 (e.g., a first power terminal 204A and a second power terminal 204B) in the illustrated embodiment, but may have a different number of power terminals 204 in other embodiments. The power terminals 204 extend into different corresponding cavities 214 of the housing 202. Portions of the power terminals 204 project outside of the cavities 214 beyond the back side 212 of the housing 202. Each of the power terminals 204 is mechanically secured to a different corresponding power cable 216 to electrically connect the respective power terminal 204 to the corresponding power cable 216. The power cables 216 extend from the power terminals 204 to the battery pack 106 (shown in FIG. 1), and are configured to convey electric current for charging the battery pack 106. The power terminals 204 engage one or more conductors 218 of the power cables 216 at interfaces located outside of the housing 202 in FIG. 2. In an embodiment, the charging inlet 110 includes a cover (not shown) that covers and encases the exposed interfaces when the cover is assembled onto the housing 202.

Figure 3:
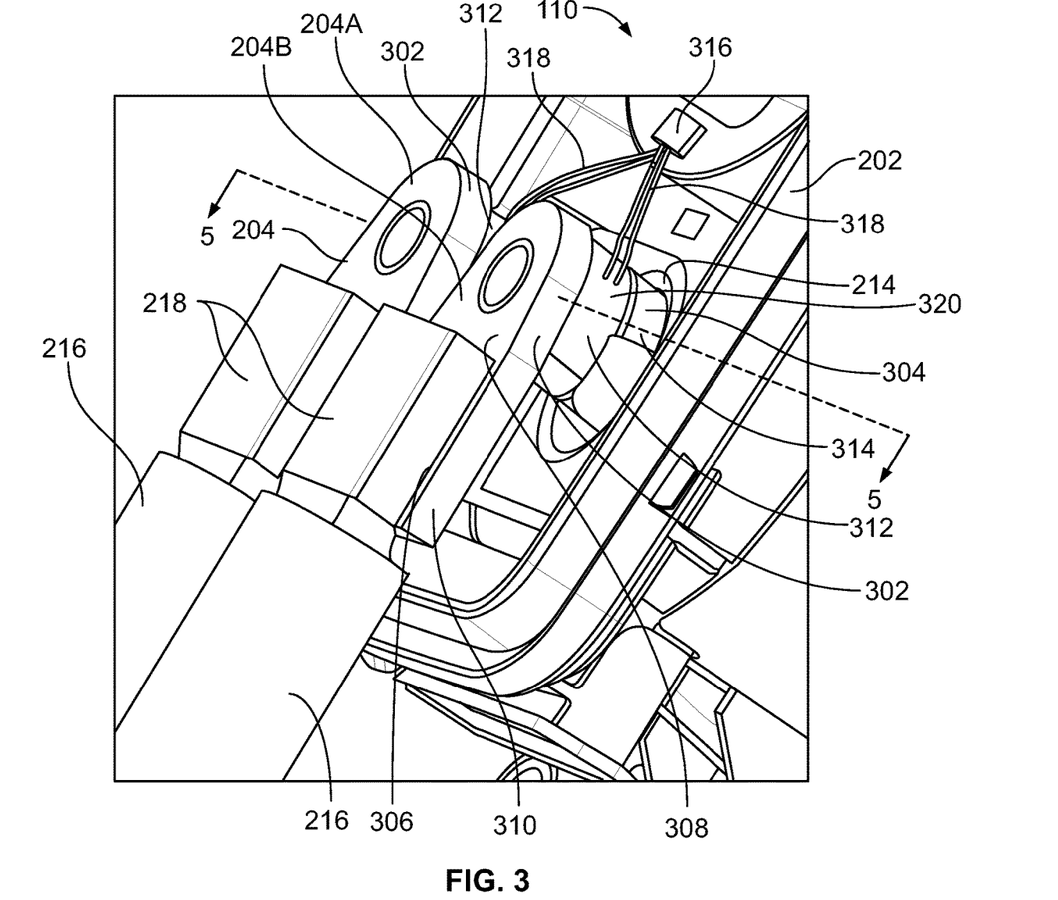
FIG. 3 is a perspective view of a portion of the charging inlet according to an embodiment.

FIG. 3 is a perspective view of a portion of the charging inlet 110 according to an embodiment. The power terminals 204 are configured to convey high power electrical energy (e.g., high voltage, high current, etc.). The power terminals 204 may be direct current (DC) fast charge terminals for conveying direct current at high current rates up to or exceeding 1000 A. The charging inlet 110 may include other power terminals held within the housing 202 in addition to the two power terminals 204. For example, although not shown in FIG. 3, the charging inlet 110 may include power terminals for conveying alternating current (AC) at reduced power levels relative to the power levels conveyed along the power terminals 204.

Each of the power terminals 204 has a head 302 that is terminated to the one or more conductors 218 of the corresponding power cable 216, and a cylindrical shaft 304 that projects from the head 302. The heads 302 are exposed outside of the housing 202, and the shafts 304 extends into the corresponding cavities 214 of the housing 202.

The head 302 in the illustrated embodiment has a termination area 306 that engages the one or more conductors 218 and mechanically couples to the conductors 218 via chemical bonding, such as welding, soldering, or the like. In a non-limiting example, the conductor(s) 218 of the power cable 216 are ultrasonically welded to the termination area 306 to irremovably mechanically couple and electrically connect the power cable 216 to the power terminal 204. The termination areas 306 may be flat and planar surfaces along a rear side 308 of the respective head 302 that faces away from the cylindrical shaft 304. As used herein, relative or spatial terms such as "front," "rear," "back," "top," "bottom," "inner," and "outer" are only used to identify and distinguish the referenced elements in the illustrated orientations shown in the figures and do not necessarily require particular positions or orientations relative to gravity and/or the surrounding environment of the charging inlet 110. In the illustrated embodiment, each head 302 of the power terminals 204 includes an elongated appendage 310 or tab that projects outward from the location where the head 302 is connected to the shaft 304. The termination areas 306 are located along the appendages 310.

The charging inlet 110 includes at least one thermal sensor 312 that measures and monitors a temperature of one or both of the power terminals 204. The charging inlet 110 includes two thermal sensors 312 in the illustrated embodiment. Each of the thermal sensor 312 is disposed on or proximate to a different one of the two power terminals 204A, 204B. The thermal sensors 312 may have the same size, shape, and components as one another. The following description of one of the thermal sensors 312 may apply to both of the thermal sensors 312.

The thermals sensor 312 includes a substrate 320 and at least one sensing element 322 (shown in FIG. 4) mounted on the substrate 320. The substrate 320 is flexible. The substrate 320 curves along a contour of at least a portion of a perimeter of the corresponding power terminal 204 on which the substrate 320 is mounted on or proximate to. For example, the thermal sensor 312 in the foreground in FIG. 3 curves along at least a portion of an outer surface 314 of the cylindrical shaft 304 of the second power terminal 204B. In the illustrated embodiment, the thermal sensor 312 is mounted to the outer surface 314 of the cylindrical shaft 304.

Although mostly obstructed in FIG. 3, the other thermal sensor 312 curves along an outer surface 314 of the cylindrical shaft 304 of the first power terminal 204A.

The thermal sensors 312 are electrically connected to a control device 316 via wires 318. The wires 318 are electrically terminated to the substrates 320 via soldering, through-hole mounting, discrete connectors, or the like. The thermal sensors 312 may generate temperature data that is conveyed as electrical signals along the wires 318 to the control device 316. The wires 318 may be insulated to electrically isolate the electrical signals from interference caused by the high current conveyed along the power terminals 204 for charging the battery pack 106 (shown in FIG. 1). The control device 316 may include one or more processors that analyze the temperature data received from the thermal sensors 312 to monitor the temperature of the power terminals 204. The temperature of the power terminals 204 may be monitored during charging operations to ensure that the power terminals 204 and other components of the charging inlet 110 do not overheat. For example, if the temperature data indicates that the temperature of the power terminals 204 exceeds a first designated threshold, the control device 316 may be programmed to automatically reduce the current transfer rate during the charging operation to reduce the temperature within the charging inlet 110. Conversely, if the temperature is determined to be below a second designated threshold that is a lower temperature than the first threshold, the control device 316 may be programmed to automatically increase the current transfer rate during the charging operation, which beneficially reduces the length of time for the battery pack 106 to charge. Although the control device 316 is shown within the housing 202 in the illustrated embodiment, the control device 316 may be disposed along an exterior of the housing 202 or spaced apart from the housing 202 in an alternative embodiment.

In an alternative embodiment, instead of the wires 318, the thermal sensors 312 may include passive or active communication circuitry for wirelessly communicating the temperature data to the control device 316. For example, the communication circuitry may receive an activation signal communicated (e.g., transmitted or broadcast) from the control device 316, and may utilize energy from the activation signal to obtain an updated temperature measurement and generate a wireless response signal to the control device 316 that includes the updated temperature measurement. The communication circuitry may be embedded within the substrate 320.

Figure 4:
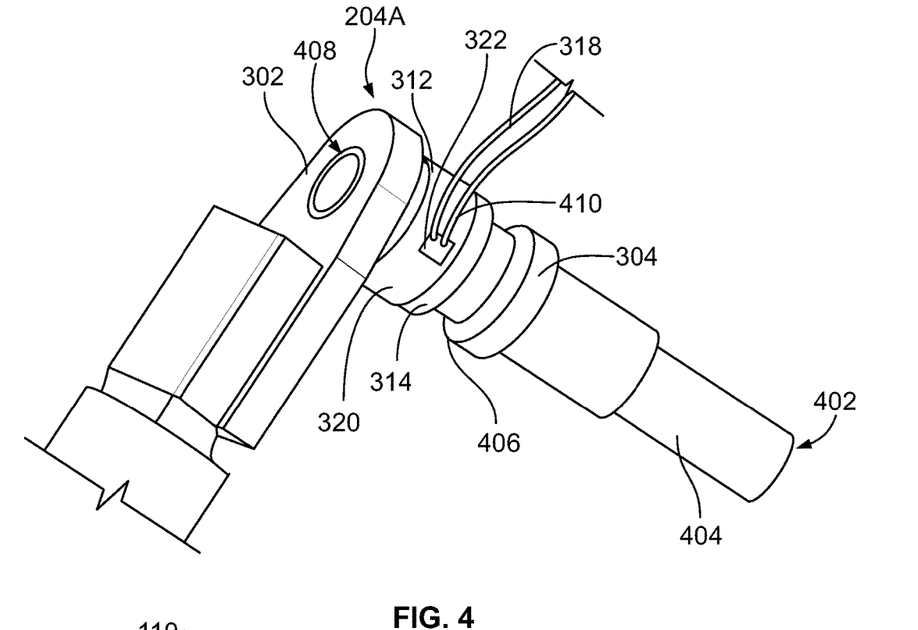
FIG. 4 is an isolated perspective view of a power terminal and a thermal sensor associated with the power terminal according to the embodiment shown in FIG. 3.

FIG. 4 is an isolated perspective view of the first power terminal 204A and the thermal sensor 312 associated with the first power terminal 204A according to the embodiment shown in FIG. 3. The following description of the first power terminal 204A and the thermal sensor 312 may also apply to the second power terminal 204B (shown in FIG. 3) and the thermal sensor 312 that curves along the second power terminal 204B, respectively.

The cylindrical shaft 304 extends from the head 302 to a mating end 402 of the power terminal 204A. The shaft 304 optionally has a varying diameter along the length thereof due to various features of the shaft 304 and spacing tolerances within the housing 202 (shown in FIG. 3). For example, the shaft 304 in the illustrated embodiment has a flange 406 that radially extends outward and has a greater diameter than portions of the shaft 304 on either side of the flange 406. The shaft 304 defines a pin-shaped contact 404 in the illustrated embodiment. The contact pin 404 extends to the mating end 402 and is configured to engage a complementary contact of the mating connector 112 (shown in FIG. 1), such as a socket contact. In an alternative embodiment, the shaft 304 may have another type of contact at the mating end 402, such as a blade, spring beam, socket, or the like.

In the illustrated embodiment, the head 302 of the power terminal 204A is a discrete component from the shaft 304. The shaft 304 is received into an opening 408 in the head 302 to mechanically couple the two components together. The shaft 304 may be threadably connected to helical threads within the opening 408, or connected via an interference fit, an adhesive, welding, or another chemical bonding. In an alternative embodiment, the power terminal 204A may be a unitary, monolithic structure such that the shaft 304 is integral to the head 302 without requiring a joining operation to couple the two components. The power terminal 204A is composed of one or more metals.

The thermal sensor 312 is disposed proximate to the head 302 in the illustrated embodiment, and does not interfere with the mating of the pin contact 404 to the complementary mating contact. The thermal sensor 312 may be located farther from the head 302 (e.g., closer to the mating end 402) in an alternative embodiment. The substrate 320 of the thermal sensor 312 is flexible and curves along at least a portion of the outer surface 314 of the cylindrical shaft 304. In an embodiment, the substrate 320 wraps around an entire perimeter (e.g., circumference) of the shaft 304, although it is recognized that only approximately half of the circumference of the shaft 304 is visible in FIG. 4. Alternatively, the substrate 320 may curve along only a sub-portion of the circumference of the shaft 304, such as along half or less than half of the circumference. The substrate 320 may be or include a polymer film, such as a polyimide film. The substrate 320 may have material properties that enable the substrate 320 to provide electrical insulation between the sensing element 322 and the power terminal 204A.

The sensing element 322 is mounted on the substrate 320. The sensing element 322 may be configured to measure the temperature of the power terminal 204A based on an electrical resistance of the sensing element 322. The sensing element 322 may be or include a thermistor, a thermocouple, a resistance temperature detector (RTD), conductive film traces or electrodes, or the like. In a non-limiting example embodiment, the sensing element 322 may be a conductive film formed via screen-printing directly onto the substrate 320. For example, the conductive film may be composed of a conductive ink, and the resistance of the conductive film may change based on temperature. The sensing element 322 may have a relatively thin thickness. In the embodiments in which the sensing element is a conductive film, the thickness of the sensing element 322 on the substrate 320 may be on the order of microns. In the illustrated embodiment, the sensing element 322 is positioned relative to the power terminal 204A such that the sensing element 322 overlaps an inner area of the shaft 304 that generally faces towards the second power terminal 204B (shown in FIG. 3). Although the sensing element 322 has a generally square shape in FIG. 4, the sensing element 322 may be more elongated along the length of the substrate 320, such that the sensing element 322 overlaps a greater circumference of the shaft 304 than shown in FIG. 4. The sensing element 322 may have a relatively large surface area to density (e.g., thickness) ratio, which enables the sensing element 322 to quickly adjust to temperature changes on or around the shaft 304. The quick temperature adjustments of the sensing element 322 advantageously allow for a short sensor response time (e.g., less lag). In an alternative embodiment, the thermal sensor 312 may include multiple sensing elements 322 on the substrate 320 instead of only one. The multiple sensing elements 322 in the alternative embodiment may be spaced apart from one another around the circumference of the shaft 304.

The thermal sensor 312 may include electrically conductive elements 410, such as traces, embedded on the substrate 320. The conductive elements 410 may be exposed along a surface of the substrate 320 or recessed relative to the surface and encased within the material of the substrate 320. The conductive elements 410 are electrically connected to the sensing element 322 and extend from the sensing element 322 to the wires 318. The conductive elements 410 convey electrical signals representing temperature data from the sensing element 322 to the wires 318 for remote communication to the control device 316 (shown in FIG. 3). In an alternative embodiment that lacks the wires 318, the conductive elements 410 may connect to wireless communication circuitry embedded on the substrate 320.

Figure 5:
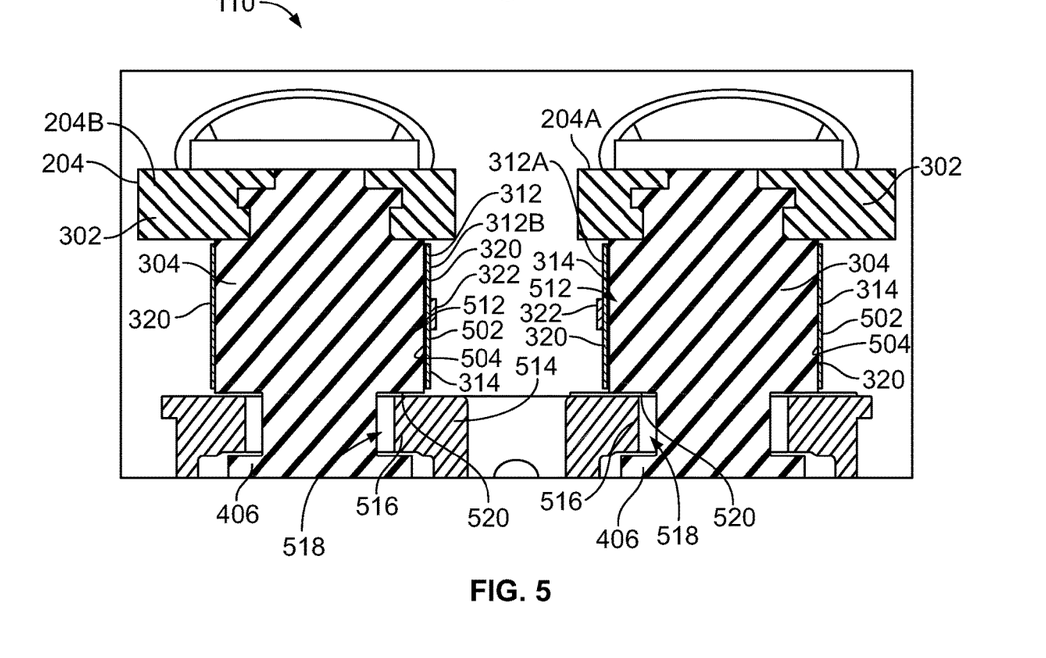
FIG. 5 is a cross-sectional view of a portion of the charging inlet taken along the line 5-5 in FIG. 3.

FIG. 5 is a cross-sectional view of a portion of the charging inlet 110 taken along the line 5-5 in FIG. 3. The cross-section extends through the first and second power terminals 204A, 204B and the two thermal sensors 312. More specifically, the cross-section extends through each of the substrates 320 of the two thermal sensors 312 at two different locations along opposite sides of the corresponding cylindrical shaft 304.

The substrate 320 of each of the thermal sensors 312 is a thin film, panel, or sheet that has a component side 502 and a mounting side 504 opposite the component side 502. The respective sensing element 322 is mounted on the component side 502 of the substrate 320. The thickness of the sensing elements 322 protruding from the corresponding substrates 320 may be exaggerated in FIG. 5 for illustrative purposes, as the sensing elements 322 may be as thin as a few microns in one or more embodiments. The mounting side 504 of the substrate 320 is mounted to the outer surface 314 of the corresponding cylindrical shaft 304. The mounting side 504 may directly engage the outer surface 314 and/or may indirectly engage the outer surface 314 via an intervening adhesive layer (not shown) that bonds the substrate 320 to the shaft 304. The adhesive may be an epoxy or another adhesive material that has heat-resistant properties to withstand high temperatures of the shaft 304 during charging operations. For example, one or more areas of the substrate 320 may directly engage the outer surface 314, and one or more other areas of the substrate 320 may indirectly engage the outer surface 314 via an adhesive. The adhesive may secure the thermal sensor 312 in a fixed position on the corresponding shaft 304 of the power terminal 204.

Because the sensing element 322 is mounted on the component side 502 of the substrate 320, the substrate 320 is extends between the shaft 304 of the corresponding power terminal 204 and the sensing element 322. The substrate 320 may provide electrical insulation between the power terminal 204 and the sensing element 322, to reduce the negative influence of electromagnetic interference on the sensing element 322 and associated temperature-sensing circuitry. Due to the insulation provided by the substrate 320, the sensing element 322 is able to be positioned proximate to the power terminal 204, as shown in FIG. 5. For example, the sensing elements 322 may only be separated from the outer surfaces 314 of the shafts 304 via the relatively thin thicknesses of the substrates 320.

The sensing elements 322 of the thermal sensors 312 according to the embodiments described herein may be located closer to the power terminals 204 than the thermal sensors of known charging inlets, and the thermal gradient between the outer surfaces 314 of the power terminals 204 and the sensing elements 322 may be less than known thermal sensors. As a result, the thermals sensors 312 described herein may be able to provide more accurate temperature measurements with quicker response times (e.g., less lag time) than known thermal sensors.

In the illustrated embodiment, the sensing elements 322 of the thermal sensors 312 are disposed between the two power terminals 204A, 204B. For example, the sensing element 322 of a first thermal sensor 312A mounted to the first power terminal 204A is positioned on the substrate 320 along an inner area 512 of the cylindrical shaft 304 thereof that generally faces towards the second power terminal 204B. Similarly, the sensing element 322 of a second thermal sensor 312B mounted to the second power terminal 204B is positioned on the substrate 320 along an inner area 512 of the cylindrical shaft 304 thereof that generally faces towards the first power terminal 204A. The sensing elements 322 may be located in the space between the two power terminals 204A, 204B because this space may absorb heat from both power terminals 204A, 204B, causing the space to be one of hottest, if not the hottest, regions of the charging inlet 110.

In the illustrated embodiment, the charging inlet 110 further includes a secondary lock 514 that is configured to secure the power terminals 204A, 204B in fixed positions within the housing 202 (shown in FIG. 3). The secondary lock 514 includes two interior rims 516 that project into annular grooves 518 of the shafts 304 of the power terminals 204A, 204B. Each of the annular grooves 518 is defined between the flange 406 of the respective shaft 304 and a shoulder 520 of the shaft 304. The shoulder 520 is axially located between the flange 406 and the head 302. The interior rims 516 are configured to engage the flanges 406 and/or the shoulders 520 of the shafts 304 to prohibit axial movement of the shafts 304 relative to the secondary lock 514. The thermal sensors 312 are axially disposed between the interior rims 516 of the secondary lock 514 and the heads 302 of the power terminals 204A, 204B. In an embodiment that lacks the use of adhesive to mount the thermal sensors 312 to the shafts 304, axial movement of the thermal sensors 312 may be limited to the clearance distances between the heads 302 and the secondary lock 514. For example, the substrates 320 may wrap around the shafts 304 and may be allowed to revolve and/or axially slide relative to the shafts 304 in the space between the heads 302 and the secondary lock 514.

Figure 6:
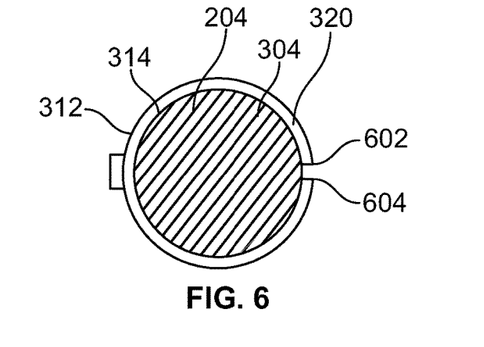
FIG. 6 is a top-down cross-sectional view of a thermal sensor curving along an outer surface of one of the power terminals of the charging inlet according to an embodiment.

FIG. 6 is a top-down cross-sectional view of one of the thermal sensors 312 curving along the outer surface 314 of one of the power terminals 204 according to an embodiment. The cross-section extends through the cylindrical shaft 304 of the power terminal 204. The power terminal 204 may represent either of the two power terminals 204A, 204B of the charging inlet 110 shown in FIG. 5. The substrate 320 of the thermal sensor 312 is elongated to extend from a first end 602 of the substrate 320 to a second end 604 that is opposite the first end 602. In the illustrated embodiment, the substrate 320 wraps around almost the entire circumference of the shaft 304. The first end 602 of the substrate 320 is proximate to the second end 604, but the two ends 602, 604 do not overlap. The substrate 320 may be mounted on the outer surface 314 of the shaft 304 via an adhesive.

Figure 7:
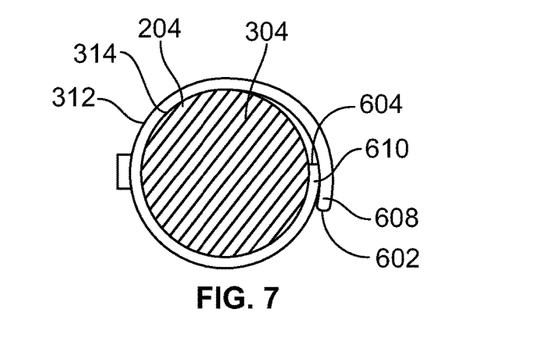
FIG. 7 is a top-down cross-sectional view of the thermal sensor curving along the outer surface of the power terminal according to another embodiment.

FIG. 7 is a top-down cross-sectional view of one of the thermal sensors 312 curving along the outer surface 314 of one of the power terminals 204 according to another embodiment. In the illustrated embodiment, the first and second ends 602, 604 of the substrate 320 overlap one another. A first segment 608 of the substrate 320 at the first end 602 overlaps a second segment 610 of the substrate 320 at the second end 604. The first segment 608 may be attached to the second segment 610 to secure the substrate 320 in an annular or ring shape that surrounds the shaft 304 of the power terminal 204. The first segment 608 may be attached to the second segment 610 via an adhesive, a fastener, a clip, or the like. In the illustrated embodiment, the substrate 320 may not require an adhesive layer between the substrate 320 and the shaft 304 to mount the substrate 320 to the shaft 304. For example, the substrate 320 is fixed in the annular shape that surrounds the shaft 304 via the engagements between the first and second segments 608, 610, and axial movement of the substrate 320 relative to the shaft 304 is restricted by the head 302 and the secondary lock 514, as described above with reference to FIG. 5.

Figure 8:
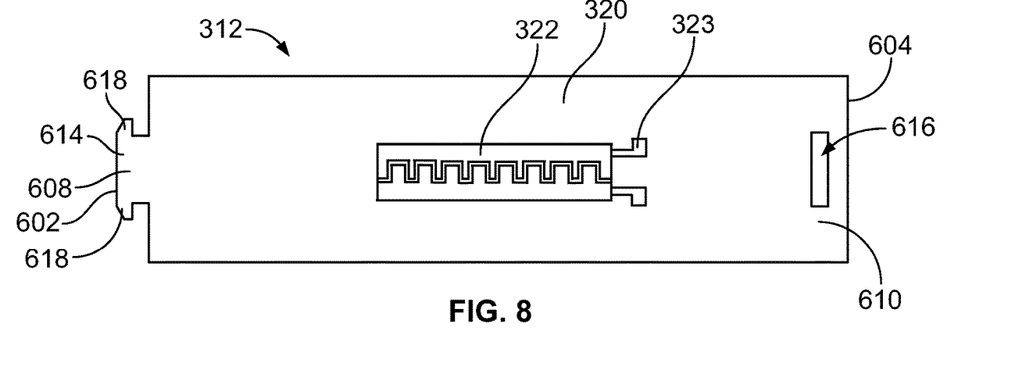
FIG. 8 is an isolated view of one of the thermal sensors in an unassembled state according to another embodiment.

FIG. 8 is an isolated view of one of the thermal sensors 312 in an unmounted and unassembled state according to another embodiment. The embodiment shown in FIG. 8 is similar to the embodiment shown in FIG. 7 except that the first segment 608 is configured to organically attach to the second segment 610 to define the annular shape without the use of a discrete fastener or an adhesive. For example, the substrate 320 is shaped such that the first segment 608 includes a tab 614, and the substrate 320 defines an aperture 616 along the second segment 610. The aperture 616 is sized to accommodate the tab 614. The tab 614 has two ears 618 that laterally project outward away from one another. The sensing element 322 is disposed on the substrate 320 spaced apart from the first and second segments 608, 610. In an embodiment, the thermal sensor 312 is mounted to one of the power terminals 204 by wrapping the substrate 320 around the cylindrical shaft 304 of the terminal 204. Like the embodiment shown in FIG. 7, the substrate 320 is long enough that the tab 614 overlaps the second segment 610. The tab 614 is inserted into the aperture 616. The ears 618 engage and catch on the areas of the substrate 320 surrounding the aperture 616 to secure substrate 320 in the annular shape around the shaft 304.

In the illustrated embodiment, the sensing element 322 includes conductive film traces that may be mounted onto the substrate 320 via in-situ screen-printing or another deposition process. The conductive film traces may have conductive particles embedded in a polymer binder. The sensing element 322 also has two electrode leads 323 that may also be screen-printed. The leads 323 may have pads to terminate to electrical wires (e.g., the wires 318 shown in FIG. 4) via soldering, welding, adhesive, fasteners, or the like. As shown in FIG. 8, the sensing element 322 is elongated along a length of the substrate 320, which allows the sensing element 322 to overlap a greater amount of the circumference of the cylindrical shaft 304 than if the sensing element 322 is more compact.

Figure 9:
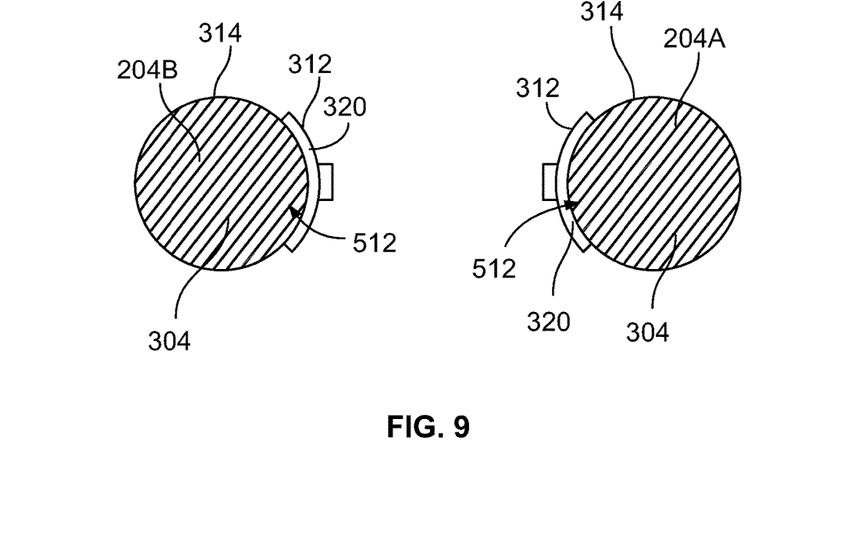
FIG. 9 is a top-down cross-sectional view of two thermal sensors curving along the outer surfaces of the power terminals according to yet another embodiment.

FIG. 9 is a top-down cross-sectional view of the two thermal sensors 312 curving along the outer surfaces 314 of the corresponding power terminals 204A, 204B according to yet another embodiment. The embodiment shown in FIG. 9 is similar to the embodiment shown in FIG. 6 except that the substrates 320 of the thermal sensors 312 wrap around less than half of the circumferences of the corresponding cylindrical shafts 304. For example, each of the substrates 320 curves along a sub-portion of the circumference that includes the inner area 512 of the corresponding cylindrical shaft 304 that faces towards the adjacent power terminal. The substrates 320 may be mounted to the shafts 304 via the use of an adhesive.

Figure 10:
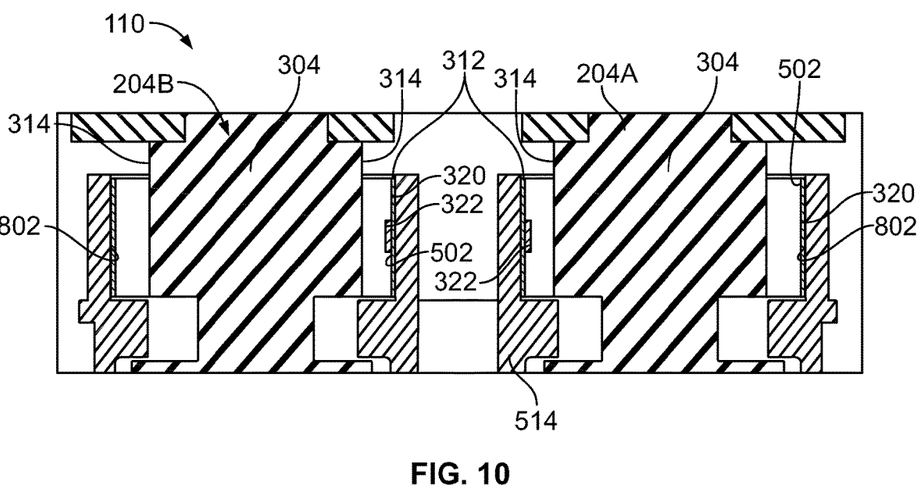
FIG. 10 is a cross-sectional view of a portion of the charging inlet taken along the line 5-5 in FIG. 3 according to an alternative embodiment.

FIG. 10 is a cross-sectional view of a portion of the charging inlet 110 taken along the line 5-5 in FIG. 3 according to an alternative embodiment. The substrates 320 of the thermal sensors 312 in the illustrated embodiment are flexible and curve around the outer surfaces 314 of the cylindrical shafts 304 of the power terminals 204A, 204B, similar to the embodiments shown in FIGS. 3 through 9. However, unlike the embodiments shown in FIGS. 3 through 9, the substrates 320 of the thermal sensors 312 in the illustrated embodiment are not mounted to the shafts 304 or any other portion of the power terminals 204A, 204B. The substrates 320 are mounted to the secondary lock 514. For example, the substrates 320 are mounted along curved surfaces 802 of the secondary lock 514. Each of the curved surfaces 802 faces and surrounds at least a portion of the outer surface 314 of the shaft 304 of the corresponding power terminal 204A, 204B. The substrates 320 may be mounted to the curved surfaces 802 via an adhesive or an interference fit. When mounted, the substrates 320 are disposed between the curved surfaces 802 of the secondary lock 514 and the outer surfaces 314 of the shafts 304. The secondary lock 514 does not extend between the thermal sensors 312 and the shafts 304, and so does not interfere with the accuracy or response time of the thermal sensors 312. In the illustrated embodiment, the component sides 502 of the substrates 320, along which the sensing elements 322 are disposed, face towards the cylindrical shafts 304. In an alternative embodiment, the orientation of the substrates 320 may be flipped such that the substrates 320 are located between the sensing elements 322 and the corresponding shafts 304 to provide electrical insulation for the sensing elements 322.

Figure 11:
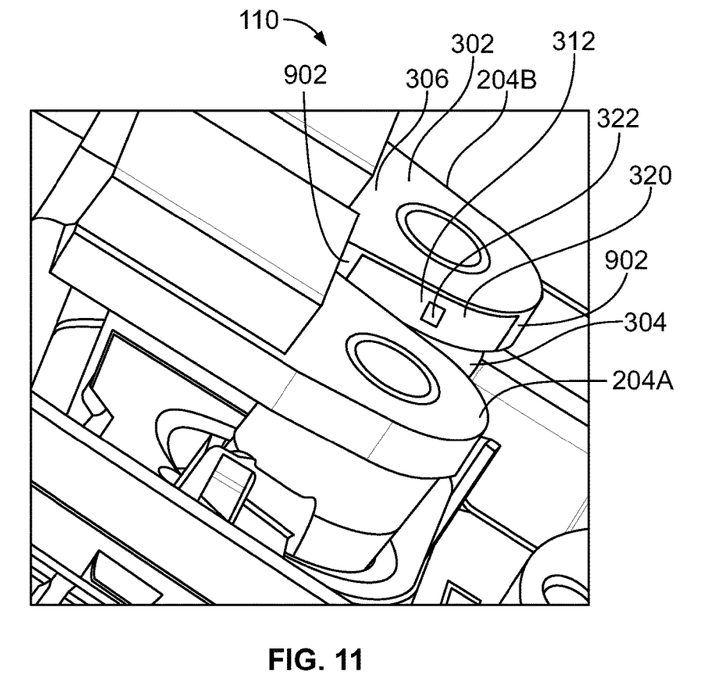
FIG. 11 is an enlarged perspective view of a portion of the charging inlet according to another alternative embodiment.

FIG. 11 is an enlarged perspective view of a portion of the charging inlet 110 according to another alternative embodiment. In FIG. 11, one thermal sensor 312 is visible. The thermal sensor 312 is mounted to the second power terminal 204B. The substrate 320 of the thermal sensor 312 curves along a contour of a portion of a perimeter of the power terminal 204B, similar to the embodiments described above. Another thermal sensor 312 may be mounted on the first power terminal 204A, but is not visible in FIG. 11. Unlike the embodiments described above, the thermal sensor 312 in FIG. 11 is mounted to an outer surface 902 of the head 302 of the power terminal 204B. The substrate 320 curves along a contour of the outer surface 902 of the head 302. The substrate 320 is spaced apart from the cylindrical shaft 304 of the power terminal 204B. The outer surface 902 may be along an edge of the head 302 that faces towards the first power terminal 204A. For example, the sensing element 322 may be positioned along an area proximate to the first power terminal 204A. The substrate 320 on the outer surface 902 is spaced apart from the termination area 306 of the head 302.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A charging inlet comprising:
a power terminal configured to releasably engage a mating contact of an external power source, the power terminal including a cylindrical shaft; and
a thermal sensor for monitoring a temperature of the power terminal, the thermal sensor including a substrate and a sensing element mounted on the substrate, the substrate having a component side and a mounting side that is opposite the component side, wherein the sensing element is mounted on the component side of the substrate, and the mounting side of the substrate is mounted to an outer surface of the cylindrical shaft,
wherein the substrate is elongated from a first end of the substrate to a second end of the substrate that is opposite the first end, the substrate wraps around an entire perimeter of the cylindrical shaft, and a first segment of the substrate at or proximate to the first end overlaps a second segment of the substrate at or proximate to the second end, the first segment secures to the second segment to secure the thermal sensor around the cylindrical shaft.

2. The charging inlet of claim 1, wherein the mounting side of the substrate is mounted to the outer surface of the cylindrical shaft via an adhesive.

3. The charging inlet of claim 1, wherein the substrate is a polyimide film.

4. The charging inlet of claim 1, wherein the first segment of the substrate includes a tab and the second segment of the substrate defines an aperture, the tab being inserted through the aperture and engaging the substrate surrounding the aperture to secure the first segment to the second segment.

5. The charging inlet of claim 1, wherein the power terminal is a first power terminal and the charging inlet includes a second power terminal disposed adjacent to the first power terminal, wherein the sensing element of the thermal sensor is located between the first and second power terminals.

6. The charging inlet of claim 1, wherein the sensing element is one of a thermistor, a thermocouple, or a resistance temperature detector.

7. The charging inlet of claim 1, wherein the sensing element includes a conductive film that is screen-printed onto the substrate.

8. The charging inlet of claim 1, wherein the power terminal includes a head having a termination area that is secured to a power cable to electrically connect the power terminal to the power cable, the cylindrical shaft extending from the head to a mating end of the power terminal.

9. The charging inlet of claim 1, wherein the substrate includes conductive elements embedded therein, the conductive elements extending from the sensing element to one or more wires spaced apart from the sensing element to convey electrical signals representing temperature data from the sensing element to the one or more wires.

10. A charging inlet comprising:
a power terminal configured to releasably engage a mating contact of an external power source, the power terminal including a cylindrical shaft;
a lock that overlaps and backs up a flange of the power terminal to secure the power terminal in a fixed position, the lock having a mounting surface that faces and surrounds at least a portion of the cylindrical shaft; and
a thermal sensor for monitoring a temperature of the power terminal, the thermal sensor including a substrate and a sensing element mounted on the substrate, wherein the substrate is mounted to the mounting surface of the lock proximate to an outer surface of the cylindrical shaft, and the sensing element is disposed between the substrate and the power terminal, the sensing element disposed adjacent the outer surface of the cylindrical shaft without engaging the outer surface.

11. The charging inlet of claim 10, wherein the substrate mounted to the lock curves around at least a portion of the power terminal and has conductive elements embedded therein, the conductive elements extend between and connect the sensing element to one or more wires that extend from the thermal sensor.

12. The charging inlet of claim 10, wherein the substrate is a polyimide film.

13. The charging inlet of claim 10, wherein the sensing element includes a conductive film that is screen-printed onto the substrate.

14. A charging inlet comprising:
a housing defining a cavity;
a power terminal held by the housing and extending into the cavity, the power terminal configured to releasably engage a mating contact of an external power source; and
a thermal sensor for monitoring a temperature of the power terminal, the thermal sensor including a substrate and a sensing element, the substrate having a component side and a mounting side opposite the component side, the sensing element being mounted on the component side of the substrate, the mounting side of the substrate being mounted to an outer surface of the power terminal, wherein the substrate is elongated from a first end of the substrate to a second end of the substrate that is opposite the first end, the substrate wraps around an entire perimeter of the power terminal and a first segment of the substrate at or proximate to the first end overlaps a second segment of the substrate at or proximate to the second end, the first segment secures to the second segment to secure the thermal sensor around the power terminal.

15. The charging inlet of claim 14, wherein the substrate of the thermal sensor is mounted to the outer surface of a cylindrical shaft of the power terminal.

16. The charging inlet of claim 14, wherein the mounting side of the substrate is mounted to the outer surface of the power terminal via an adhesive.

17. The charging inlet of claim 14, wherein the power terminal includes a head having a termination area that is secured to a power cable to electrically connect the power terminal to the power cable, wherein the outer surface of the power terminal to which the substrate is mounted is a surface of the head spaced apart from the termination area.

18. The charging inlet of claim 14, wherein the substrate is a polyimide film.

19. The charging inlet of claim 14, wherein the sensing element includes a conductive film that is screen-printed onto the substrate.

20. The charging inlet of claim 14, wherein the first segment of the substrate includes a tab and the second segment of the substrate defines an aperture, the tab being inserted through the aperture and engaging the substrate surrounding the aperture to secure the first segment to the second segment.

* * * * *